(12) United States Patent
Ito et al.

(10) Patent No.: US 11,862,425 B2
(45) Date of Patent: Jan. 2, 2024

(54) SWITCH DEVICE, AND OPENING AND CLOSING DETECTION DEVICE

(71) Applicant: ALPS ALPINE CO., LTD., Tokyo (JP)

(72) Inventors: Hideki Ito, Miyagi (JP); Takeki Uozumi, Wuxi (CN); Gengyin Li, Wuxi (CN)

(73) Assignee: ALPS ALPINE CO., LTD., Tokyo (JP)

( * ) Notice: Subject to any disclaimer, the term of this patent is extended or adjusted under 35 U.S.C. 154(b) by 174 days.

(21) Appl. No.: 17/458,865

(22) Filed: Aug. 27, 2021

(65) Prior Publication Data
US 2021/0391125 A1   Dec. 16, 2021

Related U.S. Application Data

(63) Continuation of application No. PCT/JP2020/003308, filed on Jan. 30, 2020.

(30) Foreign Application Priority Data

Mar. 6, 2019 (JP) ................................. 2019-040372

(51) Int. Cl.
H05K 5/06 (2006.01)
H01H 9/04 (2006.01)

(52) U.S. Cl.
CPC .............. H01H 9/04 (2013.01); H05K 5/06 (2013.01)

(58) Field of Classification Search
CPC .................................. H01H 9/04; H05K 5/06
USPC ........................................................ 361/837
See application file for complete search history.

(56) References Cited

U.S. PATENT DOCUMENTS

| 2,785,251 | A | | 3/1957 | Cassidy | |
|---|---|---|---|---|---|
| 3,612,801 | A | * | 10/1971 | Elliott | H01H 1/5866 200/302.3 |
| 3,781,456 | A | * | 12/1973 | Knowles | E21B 33/0407 277/606 |
| 4,103,136 | A | * | 7/1978 | Karakis | H01H 9/04 174/76 |

(Continued)

FOREIGN PATENT DOCUMENTS

| DE | 3413452 | 10/1985 |
|---|---|---|
| DE | 19757023 | 6/1999 |

(Continued)

OTHER PUBLICATIONS

Extended European Search Report for EP20766347.7 dated Mar. 21, 2023.

(Continued)

*Primary Examiner* — Anatoly Vortman
(74) *Attorney, Agent, or Firm* — IPUSA, PLLC

(57) ABSTRACT

A switch device includes a switch, a lead wire, a sealing member, and a housing. The switch includes a terminal provided on the outer side of the switch, the lead wire is fixed to the terminal, the sealing member seals a portion of the lead wire fixed to the terminal, and the housing is configured to house the sealing member. The housing has a first bottom surface and a second bottom surface. The first bottom surface has an opening through which the lead wire passes, and the second bottom surface is located closer to the switch than the first bottom surface. The sealing member abuts the second bottom surface.

11 Claims, 15 Drawing Sheets

(56) References Cited

U.S. PATENT DOCUMENTS

| | | | | |
|---|---|---|---|---|
| 4,255,638 | A * | 3/1981 | Contarino | H01H 9/04 |
| | | | | 200/302.1 |
| 4,476,360 | A * | 10/1984 | Theurer | H01H 1/58 |
| | | | | 200/302.1 |
| 4,555,686 | A * | 11/1985 | Pejouhy | H01H 37/54 |
| | | | | 337/102 |
| 5,352,858 | A * | 10/1994 | Keck | H01H 13/186 |
| | | | | 200/332 |
| 5,679,226 | A * | 10/1997 | Furusaki | G01N 27/4062 |
| | | | | 204/427 |
| 5,734,103 | A * | 3/1998 | Walding, Jr. | G01F 15/14 |
| | | | | 174/50.56 |
| 6,008,458 | A * | 12/1999 | Domzalski | H01H 15/16 |
| | | | | 200/302.1 |
| 6,236,006 | B1 | 5/2001 | Wecke | |
| 7,417,873 | B2 * | 8/2008 | Kadoya | H05K 1/189 |
| | | | | 257/E25.031 |
| 8,547,196 | B2 * | 10/2013 | Higashikata | H01H 37/54 |
| | | | | 337/380 |
| 9,093,203 | B2 * | 7/2015 | Depping | H01H 37/36 |
| 2014/0111299 | A1 * | 4/2014 | Takeda | H01H 61/01 |
| | | | | 337/85 |

FOREIGN PATENT DOCUMENTS

| | | |
|---|---|---|
| JP | S55-031262 U | 2/1980 |
| JP | S55-140216 U | 10/1980 |
| JP | S57-143627 U | 9/1982 |
| JP | S59-045815 U | 3/1984 |
| JP | S60-024026 U | 2/1985 |
| JP | 2013-225423 | 10/2013 |
| JP | 2016-122595 | 7/2016 |
| WO | 2019/008911 | 1/2019 |

OTHER PUBLICATIONS

International Search Report for PCT/JP2020/003308 dated Apr. 7, 2020.

* cited by examiner

SWITCH DEVICE, AND OPENING AND CLOSING DETECTION DEVICE

CROSS-REFERENCE TO RELATED APPLICATIONS

This application is a continuation of International Application No. PCT/JP2020/003308, filed on Jan. 30, 2020 and designating the U.S., which claims priority to Japanese Patent Application No. 2019-040372, filed on Mar. 6, 2019. The contents of these applications are incorporated herein by reference in their entirety.

BACKGROUND OF THE INVENTION

1. Field of the Invention

The disclosures herein relate to a switch device, and an opening and closing detection device.

2. Description of the Related Art

Conventionally, in vehicles such as automobiles, switch devices disposed in the vicinities of objects to detect the current states of the objects are known. For example, whether the hood of a vehicle is open or closed can be detected by disposing such a switch device in the vicinity of the hood. If such a switch device is disposed outside a vehicle, the switch device is required to be waterproof so as to prevent the switch device from malfunctioning or being damaged.

For example, Patent Document 1 describes a technology in which a plurality of projections and recesses are formed on the surface of an outer jacket of a cable such that adhesion between the cable and a filler can be improved. Further, Patent Document 2 describes a technology related to a seal structure for a multi-core cable.

However, the technology disclosed in Patent Document 1 cannot provide sufficient waterproofness, and thus, there are concerns that water entering a switch device may cause the switch device to malfunction or to be damaged. In addition, even if the technology described in Patent Document 2 is directly applied to a switch device, sufficient waterproofness is unlikely to be provided.

RELATED-ART DOCUMENTS

Patent Documents

Patent Document 1: Japanese Unexamined Utility Model Application Publication No. 59-45815
Patent Document 2: Japanese Laid-open Patent Publication No. 2016-122595

SUMMARY OF THE INVENTION

It is desirable to provide a switch device with excellent waterproofness, and an opening and closing detection device.

According to at least one embodiment, a switch device including a switch, a lead wire, a sealing member, and a housing is provided. The switch includes a terminal provided on the outer side of the switch, the lead wire is fixed to the terminal, the sealing member seals a portion of the lead wire fixed to the terminal, and the housing is configured to house the sealing member. The housing has a first bottom surface and a second bottom surface. The first bottom surface has an opening through which the lead wire passes, and the second bottom surface is located closer to the switch than the first bottom surface. The sealing member abuts the second bottom surface.

BRIEF DESCRIPTION OF THE DRAWINGS

Other objects and further features of the present invention will be apparent from the following detailed description when read in conjunction with the accompanying drawings, in which.

DESCRIPTION OF THE EMBODIMENTS

Figure 1:
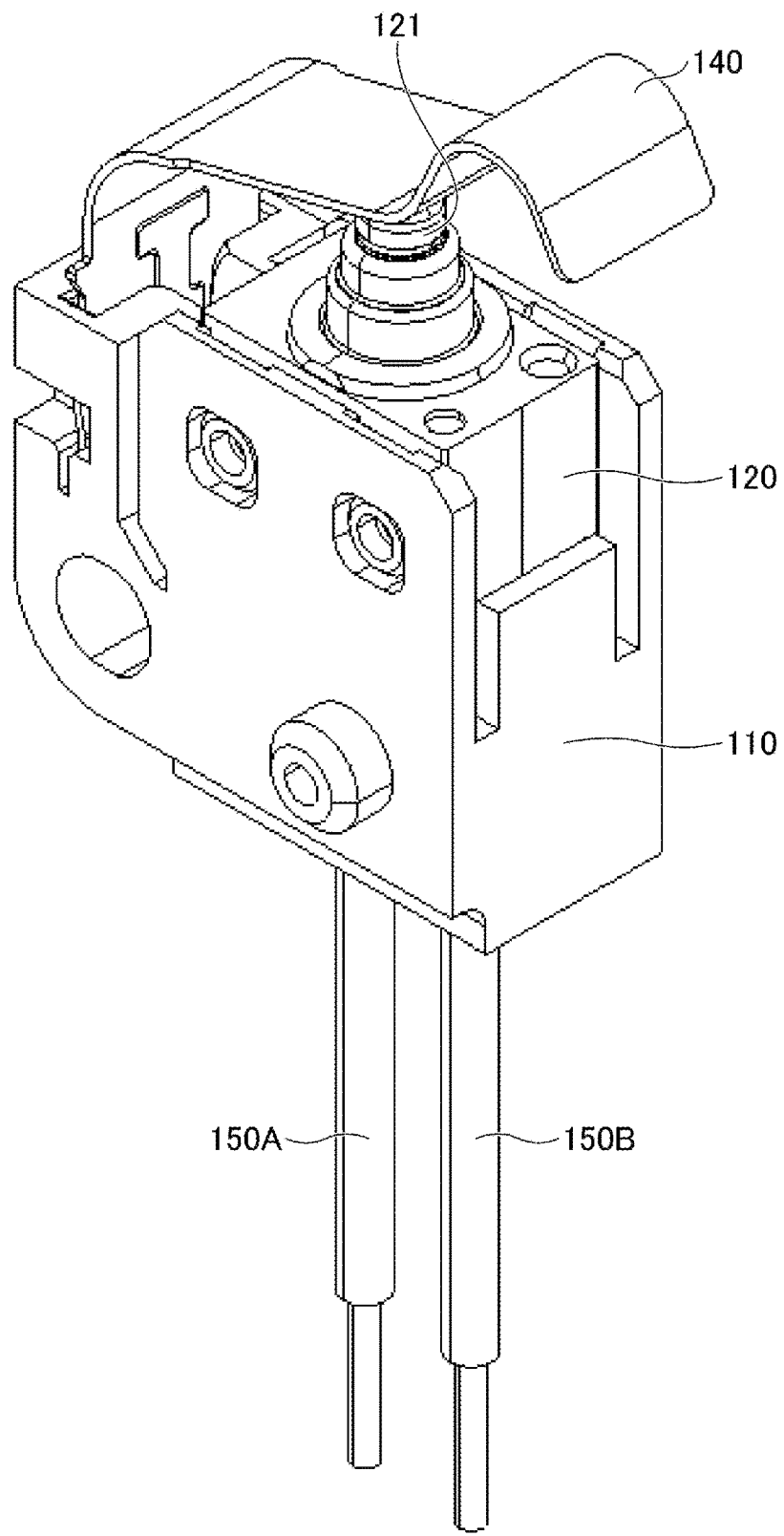
FIG. 1 is a perspective view (part 1) illustrating a configuration of a switch device according to a first embodiment.

According to at least one embodiment, excellent waterproofness can be provided.

The inventors have made earnest investigations such that excellent waterproofness can be obtained. As a result of the investigations, the inventors have found that placing a switch into a housing while pressing the switch against the bottom surface of the housing is effective in improving waterproofness. However, the inventors have also found that, if the entire bottom surface of the switch contacts the bottom surface of the housing, water entering the housing may be unable to be discharged, and thus, it may be difficult to obtain desired waterproofness. The present invention is made based on such new findings.

In the following, embodiments of the present invention will be described in detail with reference to the accompanying drawings. In the specification and the drawings, elements having substantially the same functions or configurations are denoted by the same reference numerals, and the description thereof will not be repeated. In the present disclosure, an X1-X2 direction, a Y1-Y2 direction, and a Z1-Z2 direction are perpendicular to each other. Further, a plane including the X1-X2 direction and the Y1-Y2 direction is referred to as an XY-plane, a plane including the Y1-Y2 direction and the Z1-Z2 direction is referred to as a YZ-plane, and a plane including the Z1-Z2 direction and the X1-X2 direction is referred to as a ZX-plane. For convenience, the Z1-Z2 direction is the vertical direction. A plan view means that an object is viewed from the Z1 side.

First Embodiment

Figure 2:
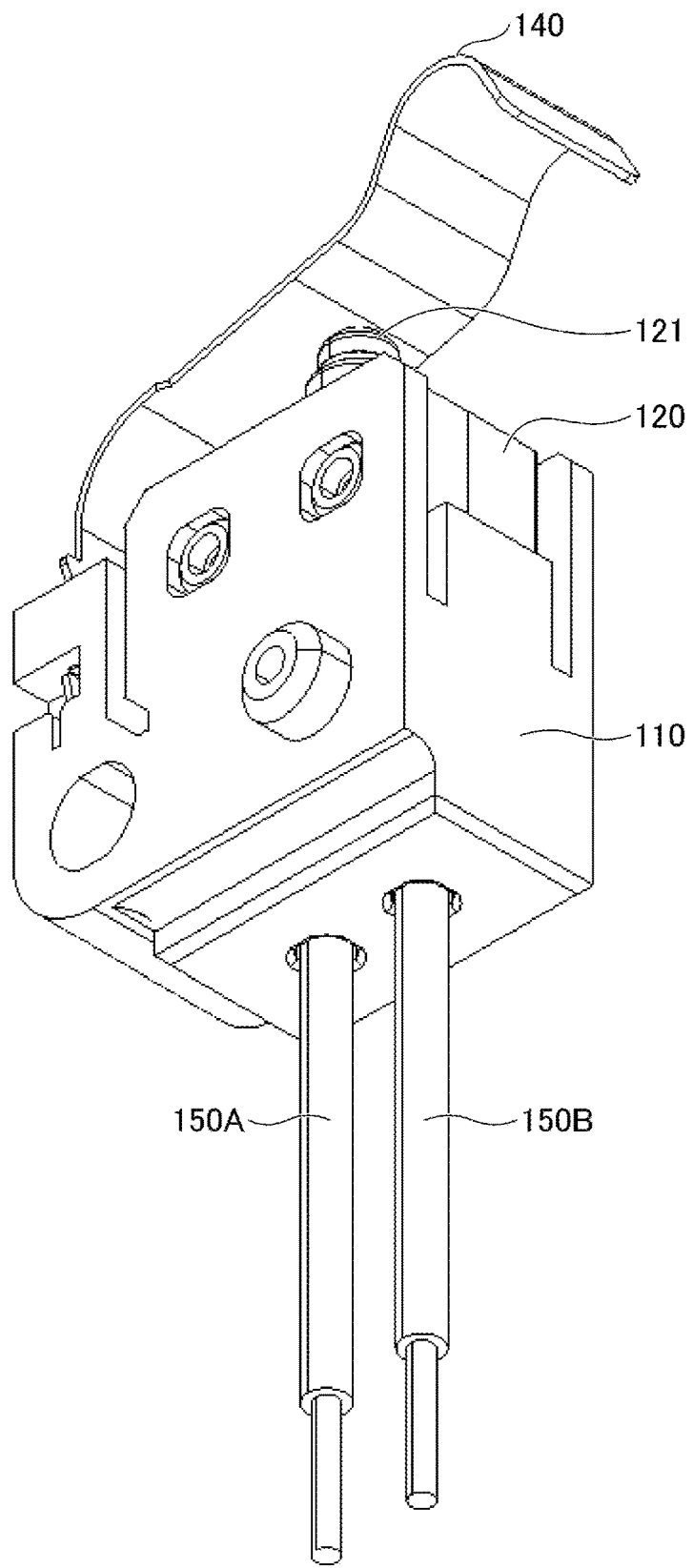
FIG. 2 is a perspective view (part 2) illustrating the configuration of the switch device according to the first embodiment.
Figure 3:
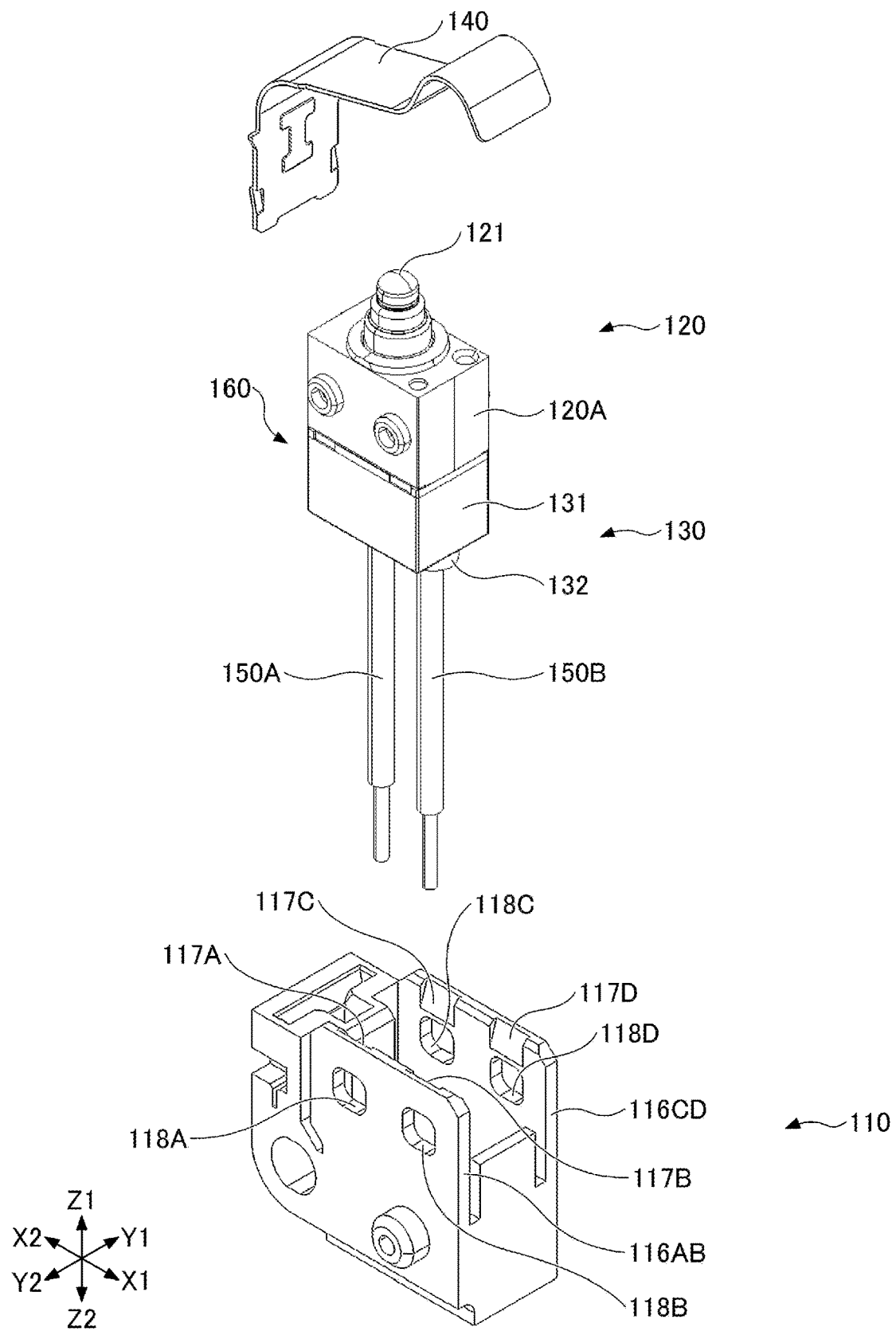
FIG. 3 is an exploded perspective view illustrating the configuration of the switch device according to the first embodiment.

A first embodiment will be described first. The first embodiment relates to a switch device. FIG. 1 and FIG. 2 are perspective views illustrating a configuration of the switch device 100 according to the first embodiment. FIG. 3 is an exploded perspective view illustrating the configuration of the switch device 100 according to the first embodiment.

The switch device 100 according to the first embodiment is a vehicle switch device. The switch device 100 switches between an on-state and an off-state in accordance with the movement of an object present in a vehicle. Accordingly, the switch device 100 can detect the current state of the object. The switch device 100 is waterproof, and is suitable for use outside the vehicle. For example, the switch device 100 can be used as an opening and closing detection device configured to detect the open/close state of a vehicle's hood, door, trunk, or the like.

As illustrated in FIG. 1 through FIG. 3, the switch device 100 includes a housing 110, a switch structure 160, and a lever 140.

Figure 4:
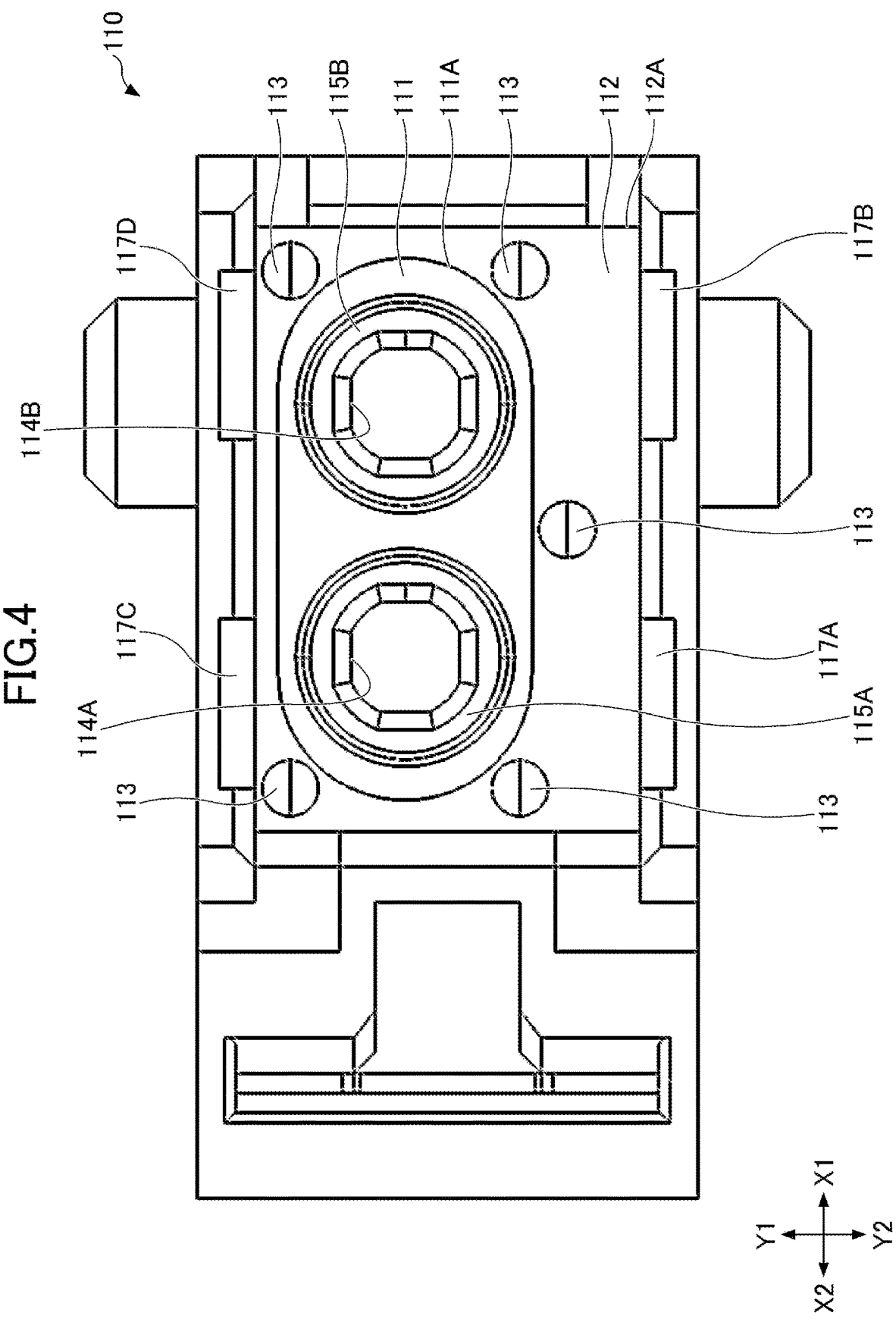
FIG. 4 is a top view illustrating a configuration of a housing.
Figure 5:
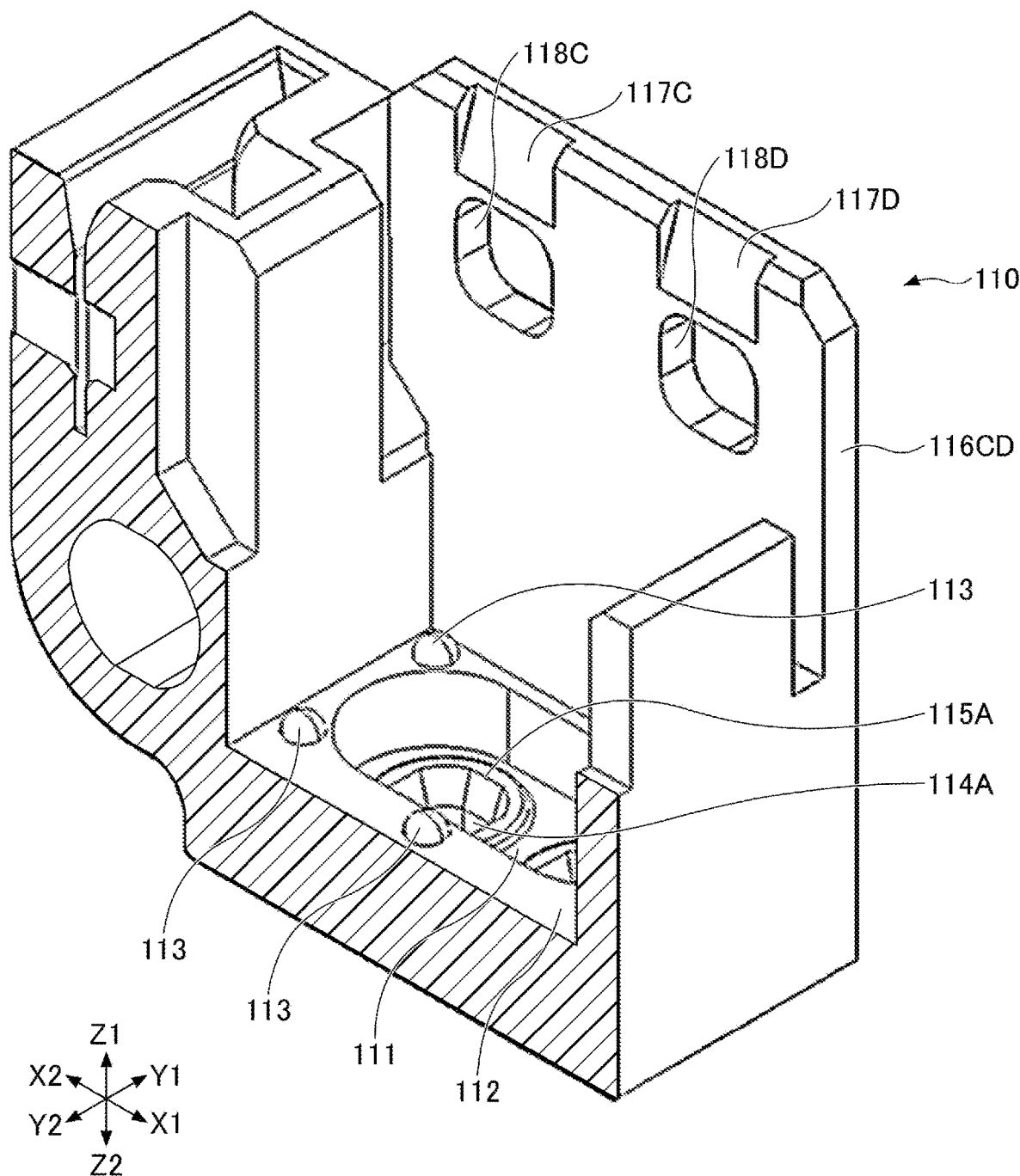
FIG. 5 is a perspective cross-sectional view (part 1) illustrating the configuration of the housing.
Figure 6:
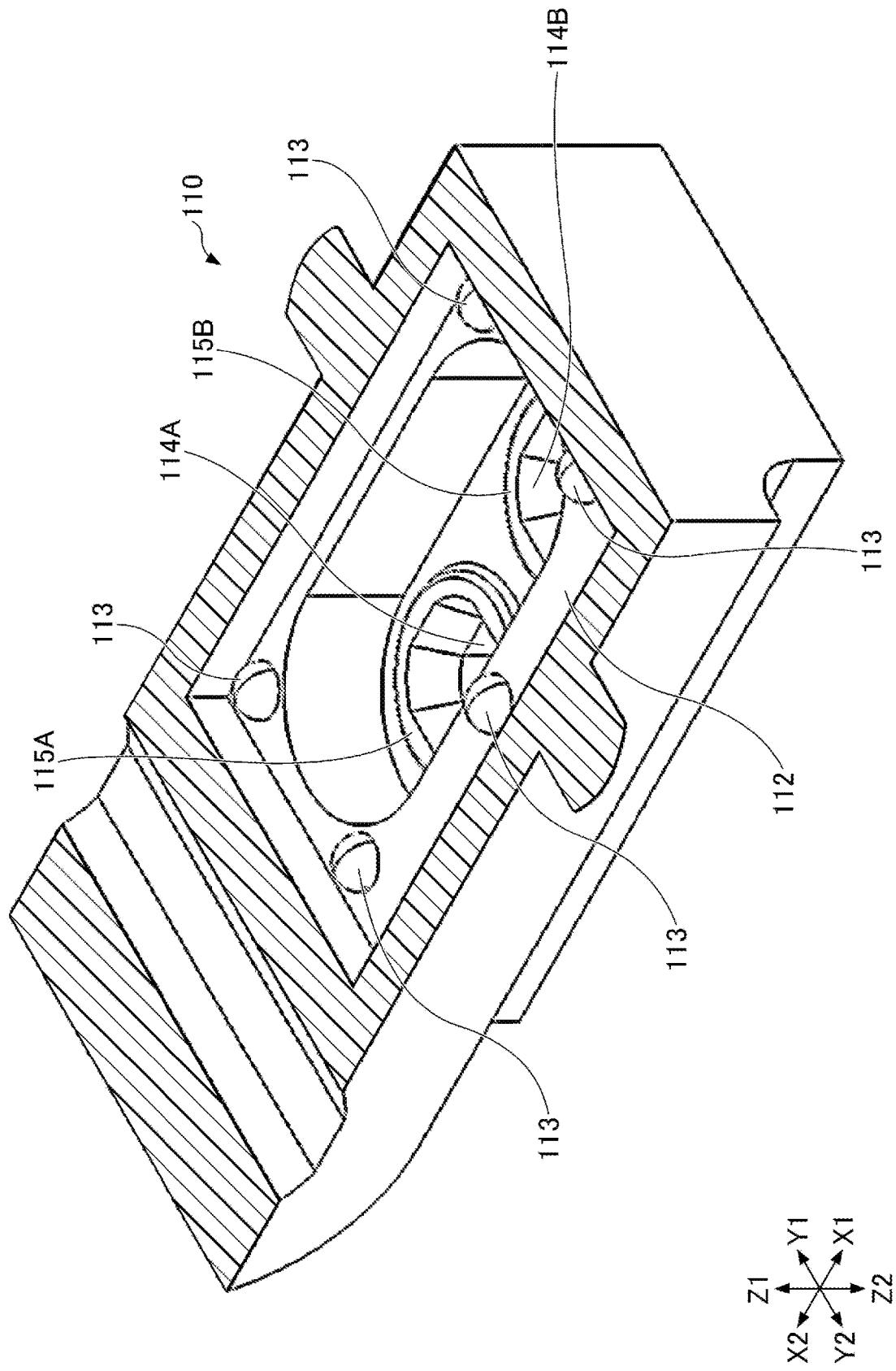
FIG. 6 is a perspective cross-sectional view (part 2) illustrating the configuration of the housing.

FIG. 4 is a top view illustrating a configuration of the housing 110. FIG. 5 and FIG. 6 are perspective cross-sectional views illustrating the configuration of the housing 110.

The housing 110 is a molded part formed of a rigid insulating material (such as a resin). The switch structure 160 is housed in the housing 110, and the lever 140 is attached to the housing 110. The housing 110 is a container having an opening at the top, and the switch structure 160 is housed in the housing 110 through the opening.

The housing 110 has a first bottom surface 111 and a second bottom surface 112 at the bottom of the housing 110. The second bottom surface 112 is provided around the first bottom surface 111 in plan view, and the first bottom surface 111 is deeper than the second bottom surface 112. That is, an outer edge 112A of the second bottom surface 112 is located outward relative to an outer edge 111A of the first bottom surface 111. Therefore, there is a step between the first bottom surface 111 and the second bottom surface 112. The first bottom surface 111 has an opening 114A and an opening 114B. A lead wire 150A passes through the opening 114A, and a lead wire 150B passes through the opening 114B. An annular raised portion 115A is formed around the opening 114A and an annular raised portion 115B is formed around the opening 114B. Three or more, in this example, five dome-shaped projections 113 are formed on the second bottom surface 112. For example, at least three projections 113 of the three or more projections 113 are not on the same straight line. The projections 113 project to the Z1 side, that is, the side opposite to the first bottom surface 111 side (Z2 side). The projections 113 are parts of the second bottom surface 112.

The housing 110 has a side plate 116AB and a side plate 116CD parallel to the ZX plane. A fitting hole 118A and a fitting hole 118B are formed in the side plate 116AB. Further, an inclined surface 117A and an inclined surface 117B are formed on a surface, facing the side plate 116CD, of the side plate 116AB. The inclined surface 117A is located above the fitting hole 118A, and the inclined surface 117B is located above the fitting hole 118B. The inclined surface 117A and the inclined surface 117B are inclined away from the side plate 116CD as the inclined surface 117A and the inclined surface 117B approach the upper end of the side plate 116AB. A fitting hole 118C and a fitting hole 118D are formed in the side plate 116CD. Further, an inclined surface 117C and an inclined surface 117D are formed on a surface, facing the side plate 116AB, of the side plate 116CD. The inclined surface 117C is located above the fitting hole 118C, and the inclined surface 117D is located above the fitting hole 118D. The inclined surface 117C and the inclined surface 117D are inclined away from the side plate 116AB as the inclined surface 117C and the inclined surface 117D approach the upper end of the side plate 116CD. The side plate 116AB and the side plate 116CD are flexible and can be curved in the thickness direction (Y1-Y2 direction) of the side plate 116AB and the side plate 116CD.

Figure 7:
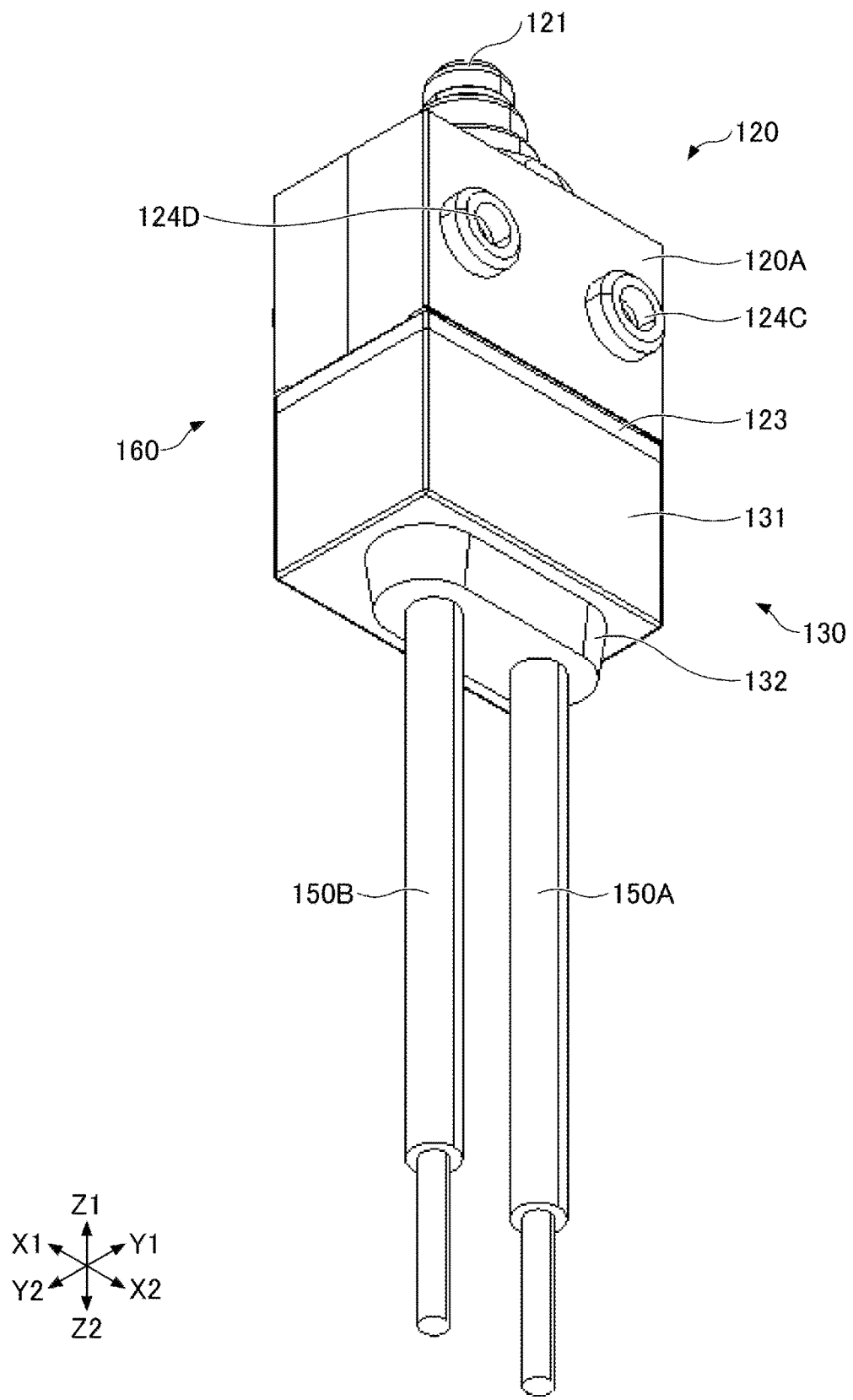
FIG. 7 is a perspective view illustrating a configuration of a switch structure.
Figure 8A:
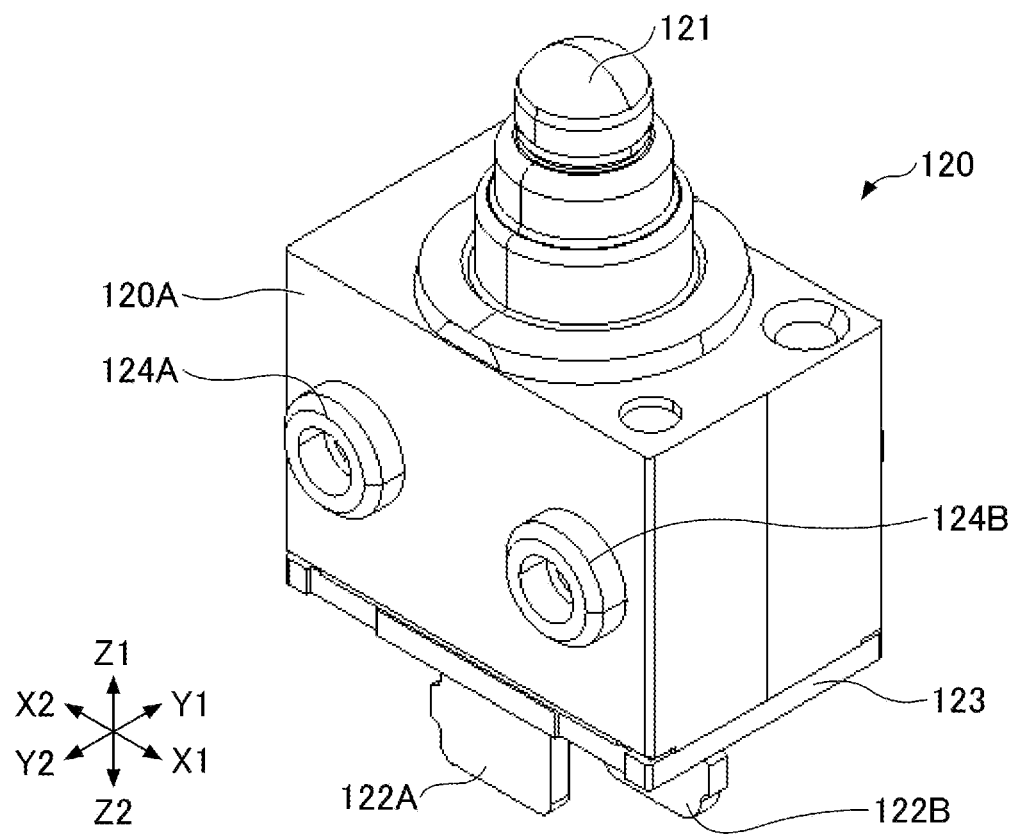
FIG. 8A is a perspective view illustrating a configuration of a switch.
Figure 8B:
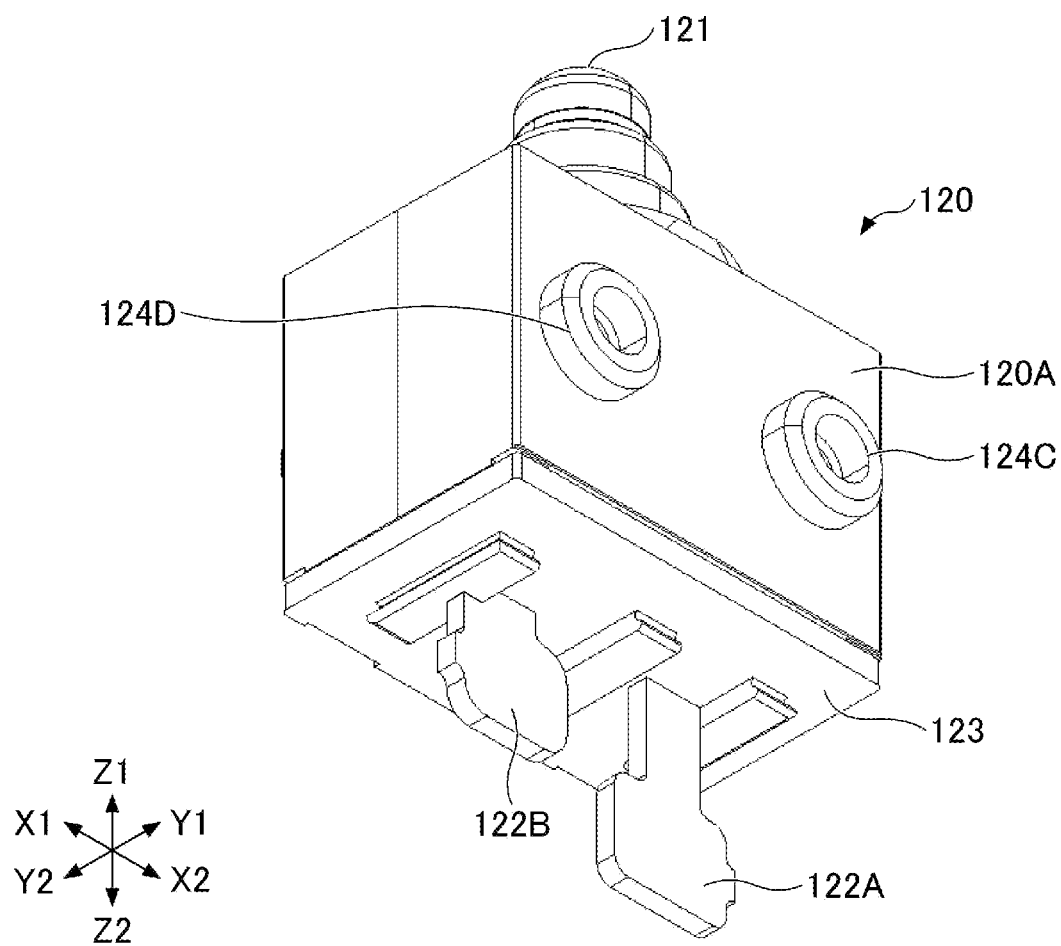
FIG. 8B is a perspective view illustrating the configuration of the switch.
Figure 9:
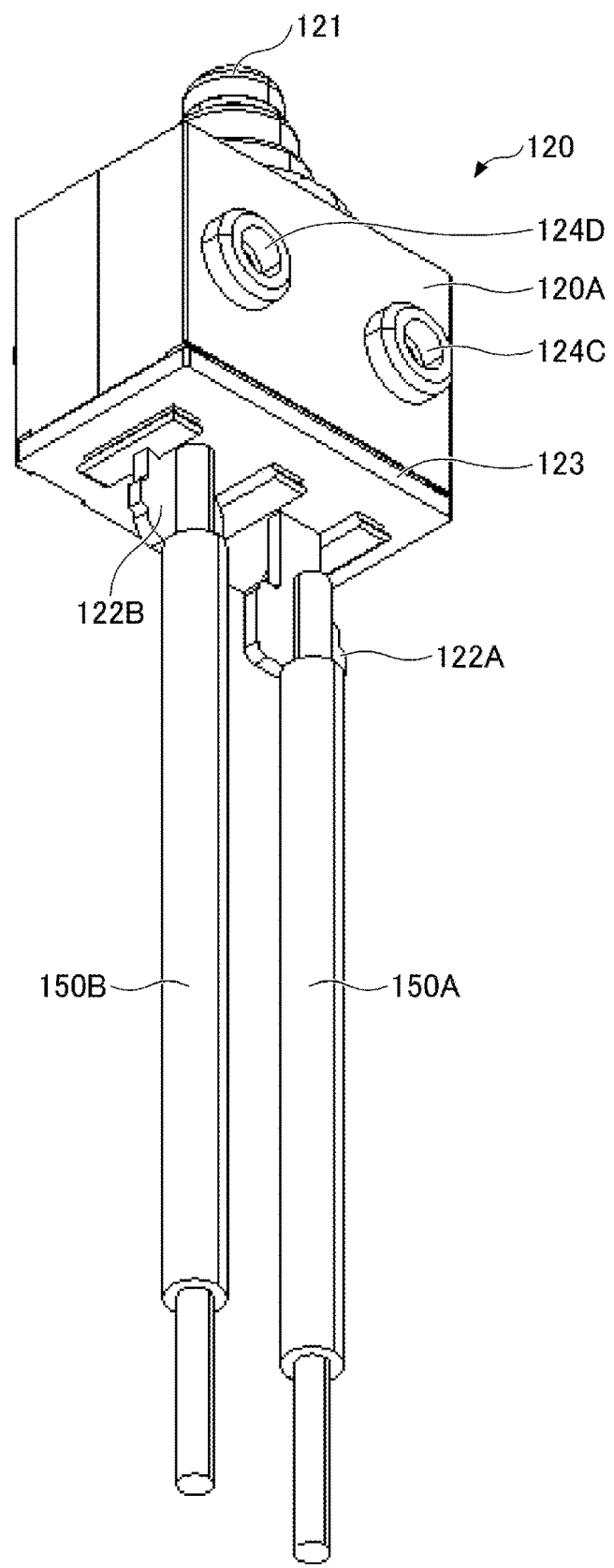
FIG. 9 is a perspective view illustrating the relationship between the switch and lead wires.
Figure 10:
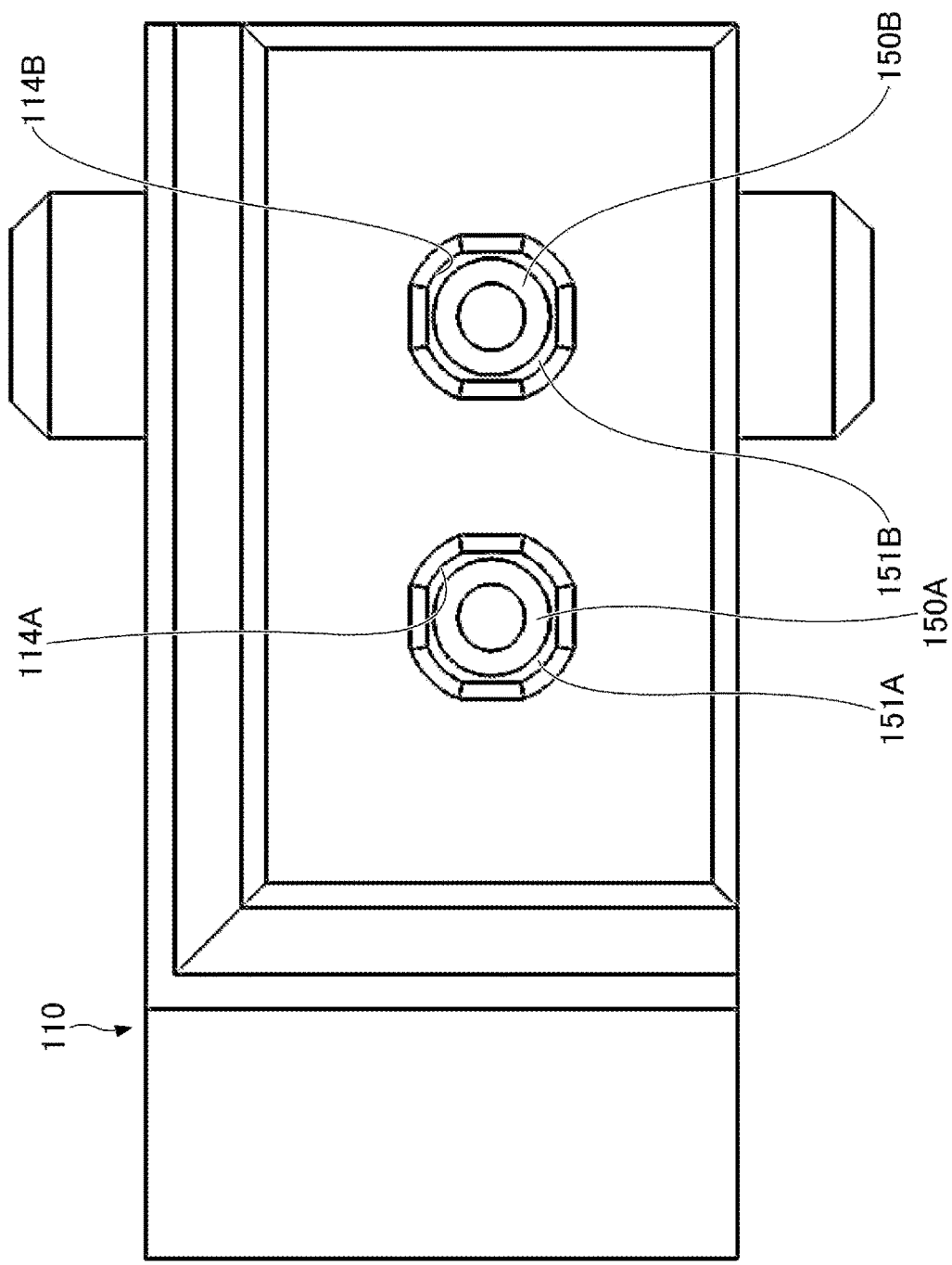
FIG. 10 is a bottom view illustrating the relationship between the housing and the lead wires.

FIG. 7 is a perspective view illustrating a configuration of the switch structure 160. FIG. 8A and FIG. 8B are perspective views illustrating a configuration of a switch 120. FIG. 9 is a perspective view illustrating the relationship between the switch 120 and the lead wires 150A and 150B. FIG. 10 is a bottom view illustrating the relationship between the housing 110 and the lead wires 150A and 150B.

As described above, the switch structure 160 is housed in the housing 110. The switch structure 160 includes the switch 120, a sealing member 130, the lead wire 150A, and the lead wire 150B.

The switch 120 includes a case 120A, a button 121, a wafer 123, a terminal 122A, and a terminal 122B. The case 120A has a substantially rectangular shape having two flat surfaces parallel to the ZX plane and two flat surfaces parallel to the YZ plane. Of the two flat surfaces parallel to the ZX plane, a boss 124A and a boss 124B are formed on the flat surface on the Y2 side of the case 120A, and a boss 124C and a boss 124D are formed on the flat surface on the Y1 side of the case 120A. The boss 124A is fitted into the fitting hole 118A, the boss 124B is fitted into the fitting hole 118B, the boss 124C is fitted into the fitting hole 118C, and the boss 124D is fitted into the fitting hole 118D. The boss 124A through the boss 124D are an example of a fitting projection.

The terminal 122A and the terminal 122B are flat plate-shaped members that project from the bottom surface of the case 120A. The lead wire 150A is electrically and physically connected to the terminal 122A, and the lead wire 150B is electrically and physically connected to the terminal 122B. For example, the lead wire 150A and the lead wire 150B are respectively connected to the terminal 122A and the terminal 122B with solder. The lead wire 150A and the lead wire 150B may be respectively fixed to the terminal 122A and the terminal 122B by welding. The terminal 122A and the terminal 122B are formed of an electrically conductive rigid material (such as a metallic material). The button 121 is a member that projects from the top surface of the case 120A of the switch 120 and can be pressed such that the switch 120 switches between an on-state and an off-state. For example, upon the button 121 being pressed, the switch 120 switches the state to the on-state (that is, the terminal 122A is electrically connected to the terminal 122B). Upon the button 121 being released, the switch 120 switches the state to the off-state (that is, the terminal 122A is not electrically connected to the terminal 122B). The wafer 123 is provided on the bottom surface of the case 120A, and supports the terminal 122A and the terminal 122B in an upright position. Each of the case 120A and the wafer 123 is a molded part formed of a rigid insulating material (such as a resin).

The sealing member 130 seals a portion of the lead wire 150A fixed to the terminal 122A and a portion of the lead wire 150B fixed to the terminal 122B. The sealing member 130 is elastic. For example, the sealing member 130 can include a hot melt adhesive. The sealing member 130 includes a base portion 131 and a protruding portion 132. The shape of the base portion 131 in the XY plane conforms to the shape of the case 120A in the XY plane, and the protruding portion 132 protrudes downward (to the Z2 side) from the center of the bottom surface of the base portion 131 along the lead wire 150A and the lead wire 150B. The base portion 131 has a substantially rectangular shape. Basically, the protruding portion 132 is housed in a space formed by the step between the first bottom surface 111 and the second bottom surface 112. The base portion 131 and the case 120A are housed in a space above the second bottom surface 112.

The opening 114A is wider than the outer periphery of the lead wire 150A, and the opening 114B is wider than the outer periphery of the lead wire 150B. Therefore, a gap 151A is provided between the opening 114A and the lead wire 150A, and a gap 151B is provided between the opening 114B and the lead wire 150B.

The lever 140 is a member formed of a metallic material having a thin plate shape. The lever 140 extends over the button 121 of the switch 120, and one end of the lever 140 is supported by the housing 110. Upon the other end of the lever 140 being pressed down from the outside, the button 121 of the switch 120 can be pressed down. Note that the lever 140 can be shaped according to the vehicle mode, the object to be detected, and the like.

In the following, a method for placing the switch structure 160 into the housing 110 will be described.

When the switch structure 160 is placed into the housing 110, first, the lead wire 150A is inserted into the opening 114A, and the lead wire 150B is inserted into the opening 114B. Next, the boss 124A is brought into contact with the inclined surface 117A, the boss 124B is brought into contact with the inclined surface 117B, the boss 124C is brought into contact with the inclined surface 117C, and the boss 124D is brought into contact with the inclined surface 117D.

In this state, the switch structure 160 is pushed further into the housing 110. As a result, the bosses 124A through 124D move down along the inclined surfaces 117A through 117D, and the side plate 116AB and the side plate 116CD deflect outward. Upon the switch structure 160 being pushed further into the housing 110, the sealing member 130 abuts the projections 113. Because the sealing member 130 is elastic, the sealing member 130 is compressed in the Z1-Z2 direction.

In this state, upon the switch structure 160 being pushed further into the housing 110, the boss 124A is fitted into the fitting hole 118A, the boss 124B is fitted into the fitting hole 118B, the boss 124C is fitted into the fitting hole 118C, and the boss 124D is fitted into the fitting hole 118D. As a result, the outward pressure exerted on the side plate 116AB and the side plate 116CD by the bosses 124A through 124D is released, and the switch 120 is snap-fitted into the housing 110. When pressing the switch structure 160 is stopped, the sealing member 130 compressed in the Z1-Z2 direction attempts to return to the original shape. However, because the bosses 124A through 124D are fitted into the fitting holes 118A through 118D, the sealing member 130 remains compressed. Accordingly, the sealing member 130 adheres firmly to the wafer 123 of the switch 120.

Figure 11:
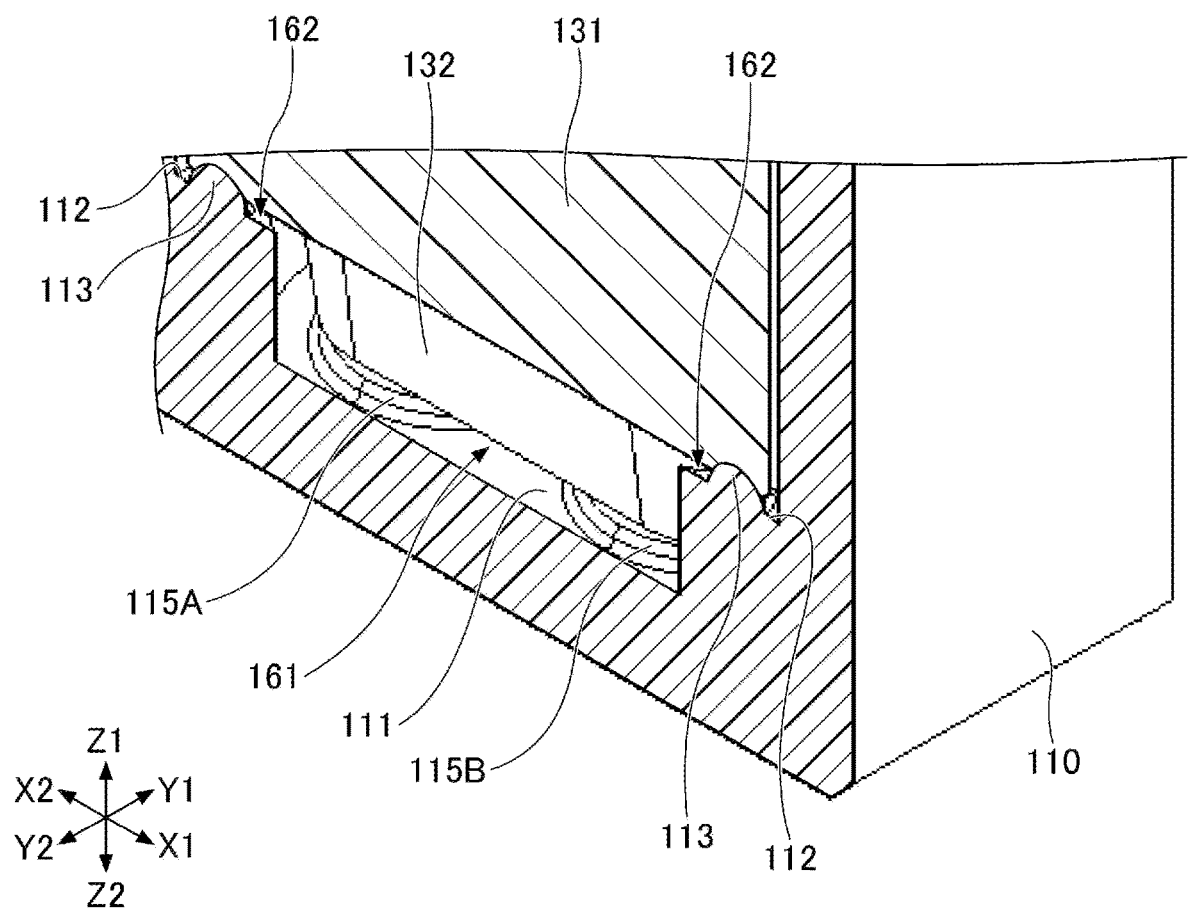
FIG. 11 is a perspective cross-sectional view illustrating the relationship between a sealing member and the housing into which the switch is snap-fitted.
Figure 12:
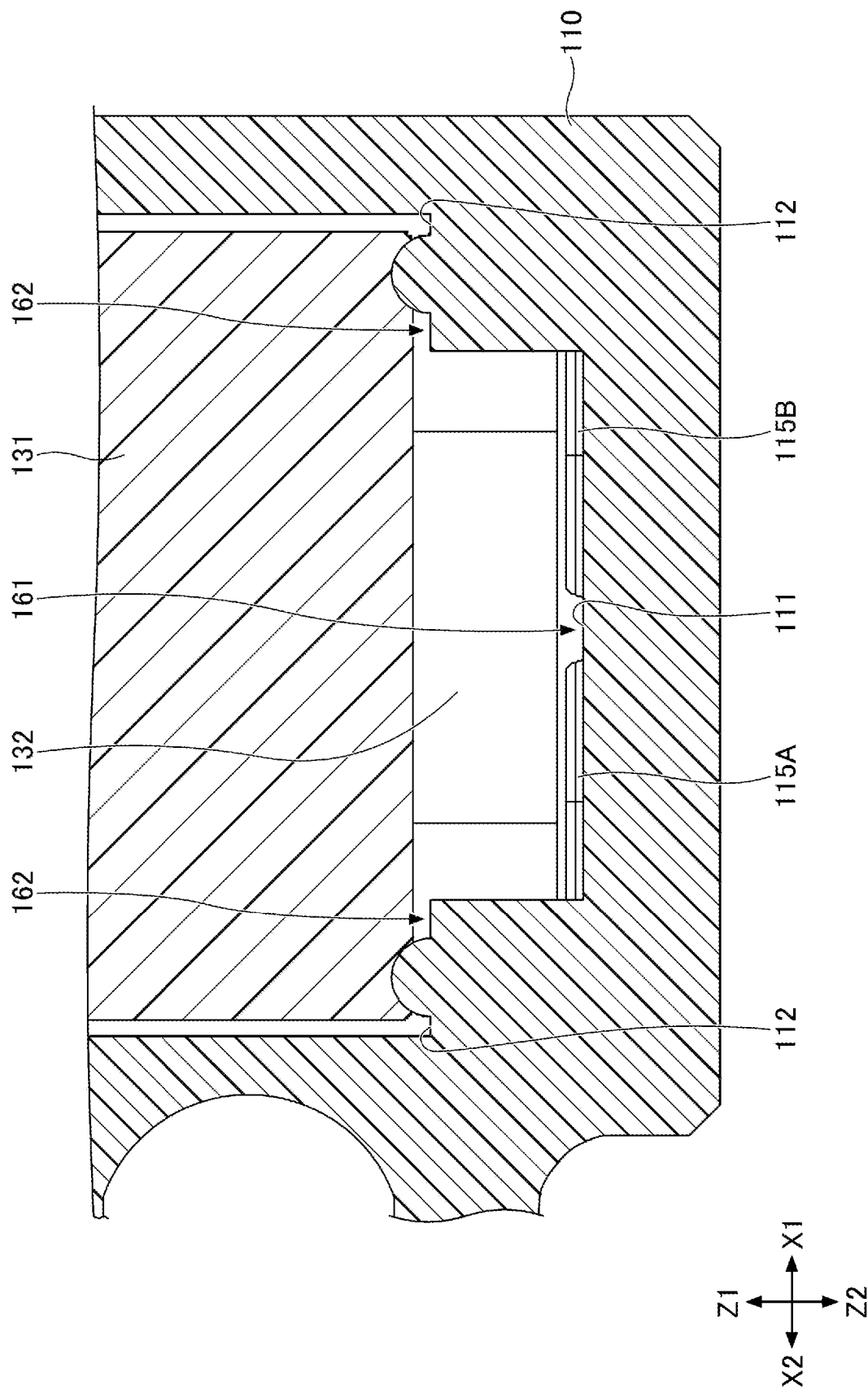
FIG. 12 is a front cross-sectional view illustrating the relationship between the sealing member and the housing into which the switch is snap-fitted.

FIG. 11 is a perspective cross-sectional view illustrating the relationship between the sealing member 130 and the housing 110 into which the switch 120 is snap-fitted. FIG. 12 is a front cross-sectional view illustrating the relationship between the sealing member 130 and the housing 110 into which the switch 120 is snap-fitted.

As illustrated in FIG. 11 and FIG. 12, the bottom surface of the base portion 131 abuts the projections 113 provided on the second bottom surface 112, and portions, abutting the projections 113, of the base portion 131 are recessed. That is, the sealing member 130 is compressed in the Z1-Z2 direction between the switch 120 and the second bottom surface 112. Further, the vicinities of the portions, pushed up by the projections 113, of the bottom surface of the base portion 131 are spaced apart from the second bottom surface 112. Thus, a second space 162 is provided between the second bottom surface 112 and the bottom surface of the base portion 131. In addition, the upper surfaces of the raised portion 115A and the raised portion 115B are spaced apart from the bottom surface of the protruding portion 132. Thus, a first space 161 is provided between the upper surfaces of the raised portions 115A and 115B and the bottom surface of the protruding portion 132.

Note that the second bottom surface 112 may have a drain passage such as a groove connecting the outer edge and the inner edge of the second bottom surface 112 in plan view. A space in such a drain passage may also function as the second space.

Further, the first bottom surface 111 may have a drain passage such as a groove leading to the opening 114A or the opening 114B. A space in such a drain passage may also function as the first space. Further, in addition to the opening 114A and the opening 114B, an opening for drainage may be formed in the first bottom surface 111.

As described above, in the switch device 100 according to the first embodiment, the opening 114A through which the lead wire 150A passes and the opening 114B through which the lead wire 150B passes are formed in the first bottom surface 111, and the sealing member 130 abuts the second bottom surface 112. Further, the second bottom surface 112 is located closer to the switch 120 than the first bottom surface 111. With this configuration, even if water enters the housing 110, the water can be discharged from the first bottom surface 111, through the gap 151A between the opening 114A and the lead wire 150A and the gap 151B between the opening 114B and the lead wire 150B, to the outside.

Further, on the outside of the housing 110, the lead wire 150A and the lead wire 150B are subjected to tensile loads in various directions. However, the adhesion between the sealing member 130 and the lead wires 150A and 150B can be well maintained, and the adhesion between the sealing member 130 and the switch 120 can also be well maintained. For example, if the lead wire 150A and the lead wire 150B are subjected to a tensile load in the Z2 direction, the switch 120 causes the sealing member 130 to be compressed against the second bottom surface 112 because the lead wire 150A and the lead wire 150B are fixed to the terminal 122A and the terminal 122B with solder or the like. Therefore, as the fixed portions are reinforced with solder or the like, the lead wire 150A and the lead wire 150B are not readily removed from the sealing member 130, and the sealing member 130 is not readily removed from the switch 120.

Further, if the lead wire 150A and the lead wire 150B are subjected to a tensile load in a given direction in the XY plane, this tensile load is converted into a tensile load in the Z2 direction within the opening 114A and the opening 114B. Therefore, similar to the above case where the lead wire 150A and the lead wire 150B are subjected to the tensile load in the Z2 direction, because the fixed portions are reinforced with solder or the like, the lead wire 150A and the lead wire 150B are not readily removed from the sealing member 130, and the sealing member 130 is not readily removed from the switch 120. Accordingly, it is possible to improve the strength against tensile loads in various directions while maintaining waterproofness.

Further, in plan view, the second bottom surface 112 is provided around the first bottom surface 111, and the outer edge 112A of the second bottom surface 112 is located outward relative to the outer edge 111A of the first bottom surface 111. Accordingly, the switch structure 160 can be readily placed into the housing 110 from above the housing 110.

Further, because the first space 161 is provided between the sealing member 130 and the first bottom surface 111, water entering the housing 110 can be securely discharged to the outside.

Further, the first bottom surface 111 may have a drain passage leading to a space outside the housing 110. Accordingly, water entering the housing 110 can be securely discharged to the outside through the drain passage.

Further, the sealing member 130 is elastic, and the switch 120 is snap-fitted into the housing 110 with the sealing member 130 being compressed between the switch 120 and the second bottom surface 112. Accordingly, the sealing member 130 adheres firmly to the switch 120. Therefore, even if a tensile load is applied to the lead wire 150A and the lead wire 150B, the sealing member 130 is highly unlikely to be removed from the switch 120, thus providing excellent waterproofness.

Further, the housing 110 has the side plate 116AB and the side plate 116CD. The side plate 116AB and the side plate 116CD contact the side surfaces of the switch 120, the side plate 116AB has the fitting hole 118A and the fitting hole 118B, and the side plate 116CD has the fitting hole 118C and the fitting hole 118D. The switch 120 has the bosses 124A through 124D on the side surfaces of the switch 120, and the bosses 124A through 124D are fitted into the fitting holes 118A through 118D. With this configuration, the switch 120 can be more securely snap-fitted into the housing 110.

Further, the second space 162 is provided between the second bottom surface 112 and the sealing member 130. Accordingly, water entering the housing 110 can be readily discharged from the second bottom surface 112 toward the first bottom surface 111.

Further, the second bottom surface 112 has the projections 113 that project to the side (Z1 side) opposite to the first bottom surface 111 side (Z2 side), and the sealing member 130 abuts the projections 113. Accordingly, the second space 162 can be secured between the second bottom surface 112 and the sealing member 130. In addition, the projections 113 push the sealing member 130 up, thus improving the adhesion strength between the sealing member 130 and the switch 120.

Second Embodiment

Figure 13:
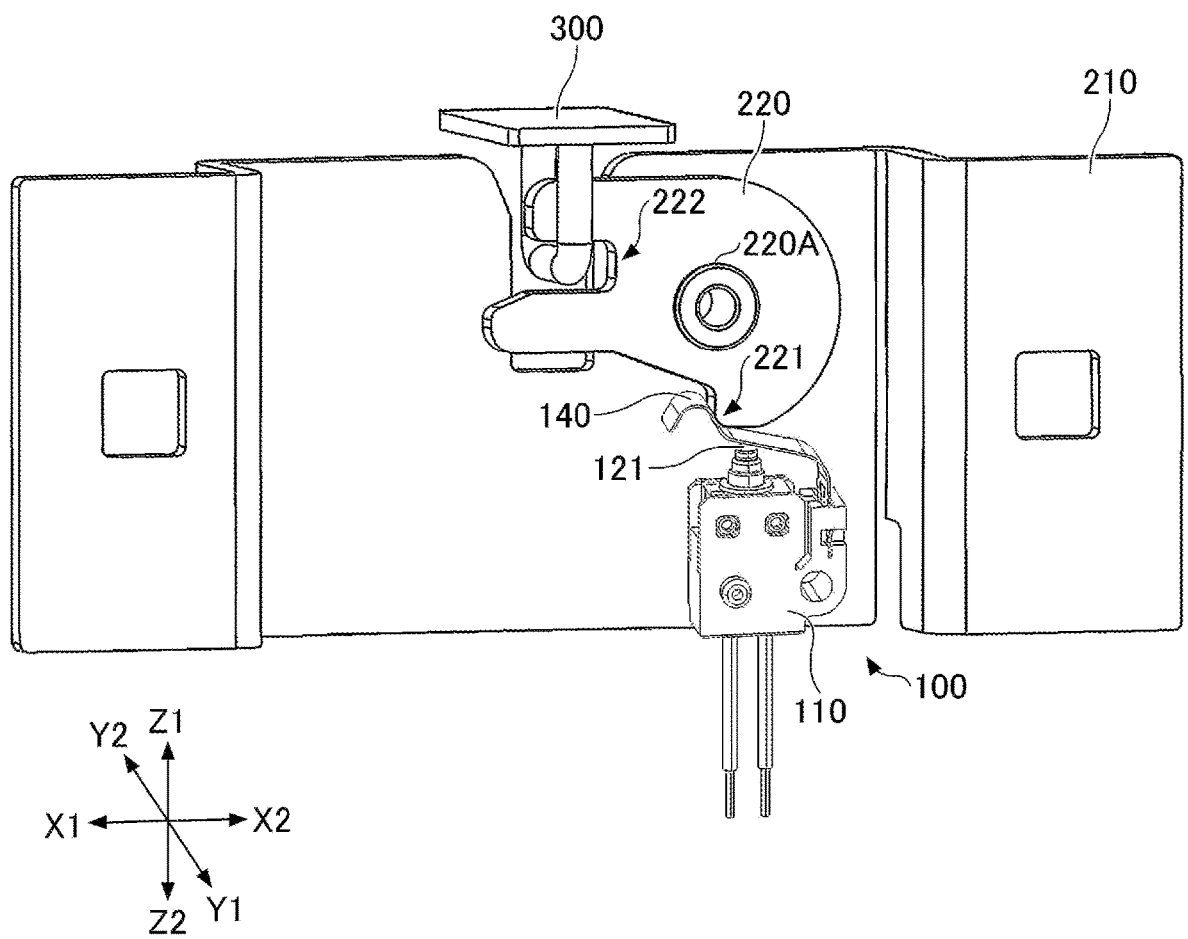
FIG. 13 is a perspective view of the exterior of an opening and closing detection device (when the hood of a vehicle is open) according to a second embodiment.
Figure 14:
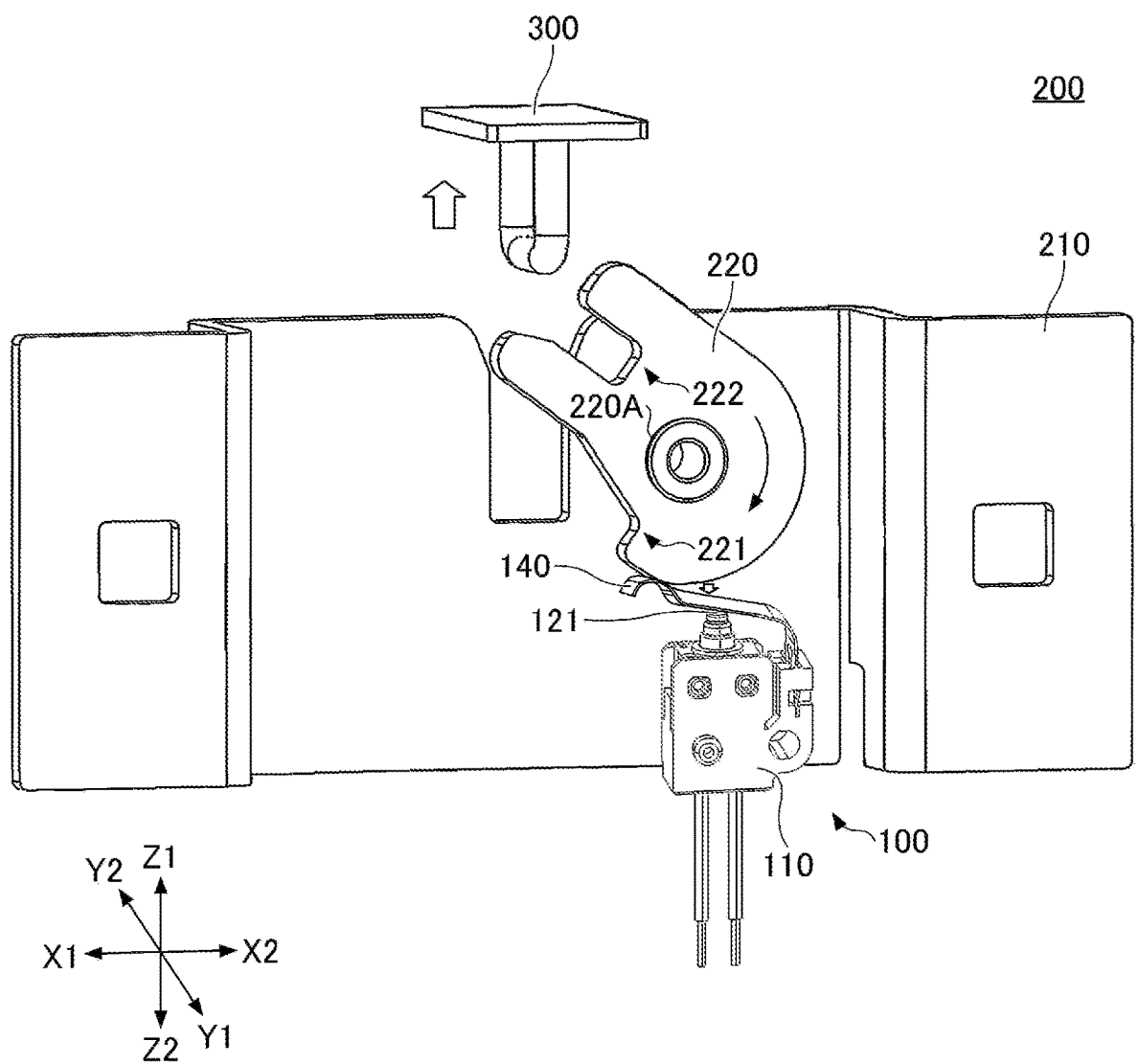
FIG. 14 is a perspective view of the exterior of the opening and closing detection device (when the hood of the vehicle is closed) according to the second embodiment.

Next, a second embodiment will be described. The second embodiment relates to an opening and closing detection device that includes the switch device 100. FIG. 13 is a perspective view of the exterior of an opening and closing detection device 200 (when the hood of a vehicle is open) according to the second embodiment. FIG. 14 is a perspective view of the exterior of the opening and closing detection device 200 (when the hood of the vehicle is closed) according to the second embodiment.

The opening and closing detection device 200 according to the second embodiment is configured to detect the open/close state of the hood of the vehicle. As illustrated in FIG. 13, the opening and closing detection device 200 includes the switch device 100 according to the first embodiment, a base plate 210, and a cam plate 220.

The base plate 210 is a member formed of a metallic material having a thin plate shape. The base plate 210 fixes the switch device 100 to the vicinity of the hood of the vehicle. In addition, the base plate 210 rotatably supports the cam plate 220. The base plate 210 can be shaped according to the vehicle model, the installation position, and the like. That is, the opening and closing detection device 200 according to the present embodiment can be applied to any of a plurality of vehicle models and used at any of a plurality of installation positions by appropriately changing the shape of the base plate 210. The base plate 210 is an example of a fixing member.

The cam plate 220 is a member formed of a metallic material having a thin plate shape. A shaft 220A of the cam plate 220 is supported by the base plate 210. Therefore, the cam plate 220 is rotatable about the shaft 220A. The cam plate 220 includes a U-shaped lever 222 capable of engaging a striker 300 of the hood. Therefore, the cam plate 220 is rotatable upon the lever 222 being moved by the striker 300 at the time of opening or closing of the hood. The cam plate 220 further includes a cam portion 221 that projects radially relative to the other portions of the cam plate 220. The cam portion 221 presses the lever 140 of the switch device 100 down as the cam plate 220 rotates. With this configuration, the cam plate 220 can convert an opening and closing movement of the hood into a switching movement of the switch 120 of the switch device 100. The cam plate 220 is an example of a conversion member.

As illustrated in FIG. 13, when the hood is closed, the lever 222 of the cam plate 220 engages the striker 300 of the hood. Thus, the cam plate 220 is maintained at a predetermined angle of rotation. In this state, the cam portion 221 of the cam plate 220 is in a position where the cam portion 221 does not press the lever 140 of the switch device 100 down. Accordingly, the switch device 100 is in the off-position.

Conversely, as illustrated in FIG. 14, when the hood is open, the striker 300 of the hood is pulled up, thus causing the lever 222 of the cam plate 220 to be pulled up. As a result, the cam plate 220 rotates clockwise about the shaft 220A, and the cam portion 221 of the cam plate 220 presses the lever 140 of the switch device 100 down. Accordingly, the switch device 100 is in the on-position.

Although the embodiments of the present invention have been described in detail above, the present invention is not limited to the particulars of the above-described embodiments. Variations and replacements may be applied to the above-described embodiments without departing from the scope of the present invention.

Further, in the above-described embodiments, the switch device according to the present invention is applied to the opening and closing detection device 200 configured to detect the open/close state of the hood of the vehicle; however, the present invention is not limited thereto. For example, the switch device according to the present invention may be applied to any other detection device configured to detect the state of a door (such as a trunk) other than the hood of the vehicle. Further, the switch device according to the present invention is not necessarily applied to the vehicle, and may be applied to any other device (such as an aircraft, a ship, an industrial machine, or a home appliance).

Further, for example, in the switch device 100 according to the above-described embodiments, the lever 140 is not necessarily provided depending on a device to which the switch device 100 is applied (that is, the button 121 of the switch 120 may be directly pressed from the outside).

Further, for example, in the switch device 100 according to the above-described embodiments, a switch including three or more terminals may be used instead of the switch 120 including the two terminals, and the number of lead wires may be changed accordingly.

Further, for example, in the switch device 100 according to the above-described embodiments, any other type of switch (such as a toggle switch or a rocker switch) may be used instead of the switch 120 (push button switch).

What is claimed is:

1. A switch device comprising:
   a switch including a terminal provided on an outer side of the switch;
   a lead wire fixed to the terminal;
   a sealing member that seals a portion of the lead wire fixed to the terminal; and
   a housing that houses the sealing member,
   wherein the housing has a first bottom surface and a second bottom surface, the second bottom surface being located closer to the switch than the first bottom surface,
   an opening through which the lead wire passes is disposed in the first bottom surface,
   the first bottom surface has a drain passage leading to a space outside the housing, and
   the sealing member abuts the second bottom surface.

2. The switch device according to claim 1, wherein an outer edge of the second bottom surface is located outward relative to an outer edge of the first bottom surface.

3. The switch device according to claim 1, wherein a first space is provided between the sealing member and the first bottom surface.

4. The switch device according to claim 1, wherein the sealing member is elastic, and the switch is snap-fitted into the housing as the sealing member is compressed between the switch and the second bottom surface.

5. The switch device according to claim 4, wherein the housing has a side plate, the side plate contacting a side surface of the switch and having a fitting hole, and
   the switch has a fitting projection on the side surface of the switch, the fitting, projection being fitted into the fitting hole.

6. The switch device according to claim 1, wherein the sealing member includes a hot melt adhesive.

7. The switch device according to claim 3, wherein a second space is provided between a part of the second bottom surface and the sealing member.

8. The switch device according to claim 1, wherein the second bottom surface has a projection that projects in a direction away from the first bottom surface, and
   the sealing member abuts the projection.

9. An opening and closing detection device comprising:
   the switch device according to claim 1;
   a fixing member configured to fix the switch device to a vicinity of a door; and
   a conversion member disposed between the door and the switch device to convert an opening and closing movement of the door into a switching movement of the switch.

10. The opening and closing detection device according to claim 9, wherein the door is a hood of a vehicle.

11. The switch device according to claim 1, wherein the drain passage is a gap between the opening disposed in the first bottom surface and an outer periphery of the lead wire.

* * * * *